United States Patent
Xie et al.

(10) Patent No.: US 9,029,920 B2
(45) Date of Patent: May 12, 2015

(54) SEMICONDUCTOR DEVICES AND METHODS OF FABRICATION WITH REDUCED GATE AND CONTACT RESISTANCES

(71) Applicants: GLOBALFOUNDRIES Inc., Grand Cayman (KY); International Business Machines Corporation, Armonk, NY (US)

(72) Inventors: Ruilong Xie, Schenectady, NY (US); Xiuyu Cai, Niskayuna, NY (US); Vimal Kamineni, Albany, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/909,328

(22) Filed: Jun. 4, 2013

(65) Prior Publication Data

US 2014/0353734 A1    Dec. 4, 2014

(51) Int. Cl.
| | |
|---|---|
| *H01L 21/28* | (2006.01) |
| *H01L 29/417* | (2006.01) |
| *H01L 29/423* | (2006.01) |
| *H01L 21/283* | (2006.01) |
| *H01L 21/8234* | (2006.01) |
| *H01L 29/66* | (2006.01) |

(52) U.S. Cl.
CPC ........ *H01L 29/42376* (2013.01); *H01L 21/283* (2013.01); *H01L 29/41775* (2013.01); *H01L 21/28088* (2013.01); *H01L 21/28114* (2013.01); *H01L 29/665* (2013.01); *H01L 29/6653* (2013.01); *H01L 29/66545* (2013.01); *H01L 29/66628* (2013.01); *H01L 21/823425* (2013.01); *H01L 21/823475* (2013.01)

(58) Field of Classification Search
CPC ................... H01L 29/78615; H01L 21/28587; H01L 21/28114; H01L 29/42376
USPC .......... 257/315, 368, 288; 438/151, 172, 197, 438/182, 579
See application file for complete search history.

(56) References Cited

U.S. PATENT DOCUMENTS

| | | | |
|---|---|---|---|
| 6,509,253 B1 | 1/2003 | Yu | |
| 6,596,598 B1 | 7/2003 | Krivokapic et al. | |
| 7,622,767 B2 | 11/2009 | Nogami et al. | |
| 8,329,546 B2 | 12/2012 | Lee et al. | |
| 2009/0206406 A1 | 8/2009 | Rachmady et al. | |
| 2012/0217513 A1* | 8/2012 | Tega et al. | 257/77 |

* cited by examiner

*Primary Examiner* — Whitney T Moore
(74) *Attorney, Agent, or Firm* — Kevin P. Radigan, Esq.; Heslin Rothenberg Farley & Mesiti P.C.

(57) ABSTRACT

Semiconductor structures with reduced gate and/or contact resistances and fabrication methods are provided. The method includes: providing a semiconductor device, which includes forming a transistor of the semiconductor device, where the transistor forming includes: forming a T-shaped gate for the transistor, the T-shaped gate being T-shaped in elevational cross-section; and forming an inverted-T-shaped contact to an active region of the transistor, the inverted-T-shaped contact including a conductive structure with an inverted T-shape in elevational cross-section.

20 Claims, 10 Drawing Sheets

SEMICONDUCTOR DEVICES AND METHODS OF FABRICATION WITH REDUCED GATE AND CONTACT RESISTANCES

FIELD OF THE INVENTION

The present invention relates in general to semiconductor devices and methods of fabricating semiconductor devices, and more particularly, to transistor structures with reduced gate and/or contact resistances, and methods of fabrication thereof.

BACKGROUND OF THE INVENTION

As is known, semiconductor devices, such as integrated circuit devices, typically include a large number of transistors within a single chip or wafer area. As integration density of transistors continues to increase, the footprint area occupied by individual transistors necessarily continues to decrease. This ever-decreasing transistor size can result in challenges to the performance characteristics of the transistors, including (for instance) undesirable changes to the gate and/or contact resistances.

BRIEF SUMMARY

The shortcomings of the prior art are overcome, and additional advantages are provided through the provision, in one aspect, of a method which includes providing a semiconductor device, which includes: forming a transistor of the semiconductor device. The forming includes: forming a T-shaped gate for the transistor, the T-shaped gate being T-shaped in elevational cross-section; and forming an inverted-T-shaped contact to an active region of the transistor, the inverted-T-shaped contact including a conductive structure with an inverted-T-shape in elevational cross-section.

In another aspect, a semiconductor device is presented herein which includes a transistor. The transistor includes a substrate, a T-shaped gate disposed over the substrate, and an inverted-T-shaped contact to an active region of the transistor. The T-shaped gate is T-shaped in elevational cross-section, and the inverted-T-shaped contact includes a conductive structure with an inverted-T-shape in elevational cross-section.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
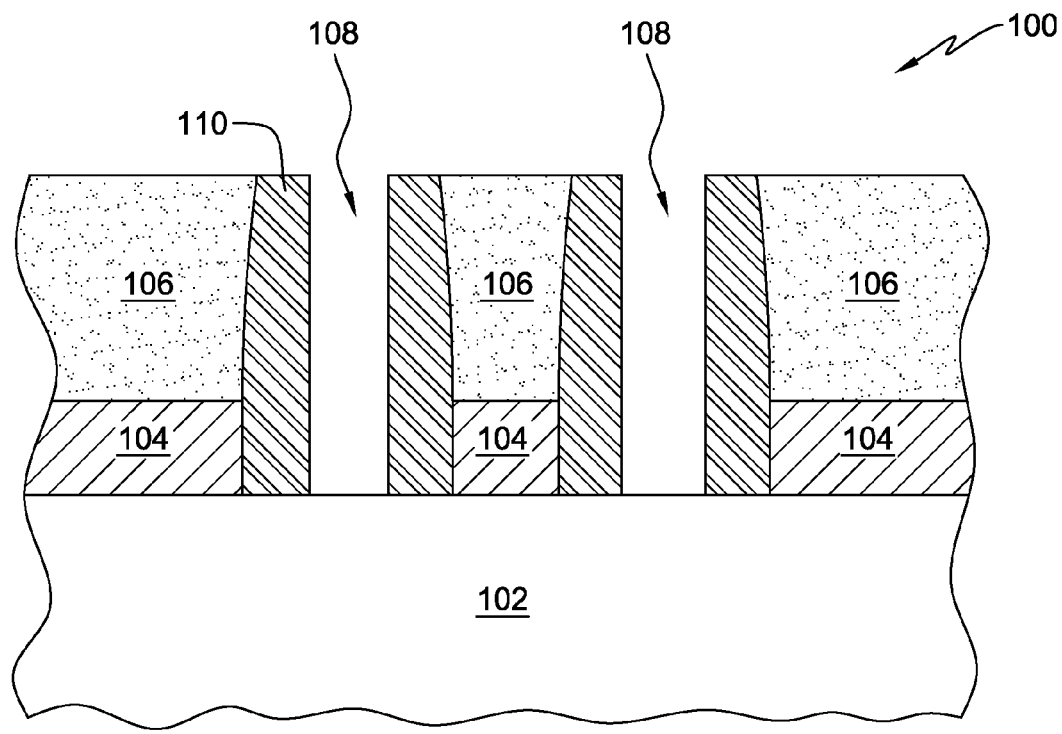
FIG. 1A is an elevational view of one embodiment of an intermediate structure obtained during a semiconductor device fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

In one aspect, semiconductor device fabrication typically includes transistor formation processing, which may involve conductive material deposition into appropriately configured openings in an intermediate circuit structure to create, for instance, gate electrodes and/or contact structures of the transistors. This is often referred to as gate metallization and contact metallization processing, respectively. As integration density of transistors continues to increase, the area available for a gate electrode, as well as for contact structures to the active regions of the transistor, continues to decrease. This decrease in available footprint area for gate electrodes and contact structures may result in increasing resistances, that is, an increasing gate electrode resistance and/or an increasing contact structure resistance. As semiconductor device fabrication processing transitions to gate pitch 64 nanometers processing and below, such resistance changes have the potential to significantly degrade performance of the resultant device(s).

To address this issue, disclosed herein are certain novel transistor configurations and methods of fabrication, which are particularly suited for sub-64 nm gate pitch semiconductor fabrication technology. For instance, a method is presented for reducing resistance at the gate electrode and resistance at the contact structures of one or more transistors of a semiconductor device, notwithstanding a decrease in available footprint by increasing, or at least maintaining, the cross-sectional area of selected features of (for instance) the gate electrodes and contact structures disclosed therein. In one embodiment, the cross-sectional contact area of a gate electrode is increased or maintained larger by tailoring the electrode to have a T-shape, with a horizontal portion over a vertical portion. In such a configuration, the horizontal portion extends laterally out from the vertical portion of the T-shaped gate. In another aspect, the cross-sectional area of the contact structures (in particular, of self-aligned contact structures) to the active regions is increased, or maintained larger, by tailoring the contact structure to have an inverted-T-shaped configuration, with a vertical portion over a horizontal portion. In such a configuration, the vertical portion is defined, at least in part, by vertically extending contact material disposed over a horizontally-extending portion that may include a contact liner, with the contact liner residing over and electrically contacting to an active region of the transistor, such as the source or drain region of the transistor.

Generally stated, provided herein, in one aspect, is a method of providing a semiconductor device which includes forming a transistor of the semiconductor device, where the transistor forming includes forming a T-shaped gate for the transistor, the T-shaped gate being T-shaped in elevational cross-section, and forming an inverted-T-shaped contact to an active region of the transistor, the inverted-T-shaped contact including a conductive structure with an inverted-T-shape in elevational cross-section. Forming the transistor may further include providing a sidewall spacer adjacent to the T-shaped gate of the transistor and at least partially separating the T-shaped gate and the inverted-T-shaped contact, with a portion of the T-shaped gate extending over the sidewall spacer.

In one aspect, forming the transistor may further include forming a first sidewall spacer as noted above, as well as providing a second sidewall spacer adjacent to the T-shaped gate and at least partially separating the T-shaped gate and the inverted-T-shaped contact of the transistor, the second sidewall spacer residing, at least partially above the first sidewall spacer. Forming the transistor may further include providing the second sidewall spacer with an outer wall away from the T-shaped gate which extends beyond an outer wall of the first sidewall spacer away from the gate. The second sidewall spacer may include a reverse sidewall spacer contacting a sidewall of the T-shaped gate of the transistor. The first sidewall spacer may be fabricated of a first material and the second sidewall spacer may be fabricated of a second material, with the first material and the second material being different materials, and the second material having a dielectric constant less than that of the first material. In one example, the first material may be a nitride and the second material may include at least one of an oxide or a nitride. In one embodiment, the dielectric constant of the second material is less than that of silicon nitride.

In another aspect, forming the inverted-T-shaped contact may include forming the conductive structure over and in electrical contact with a silicide, with the silicide residing over or including part of the active region, where the active region may be, for instance, a drain region or a source region of the transistor.

In a further aspect, forming the T-shaped gate may include forming a horizontal portion of the T-shaped gate over a vertical portion of the T-shaped gate, where the horizontal portion extends substantially symmetrically laterally out from the vertical portion of the T-shaped gate. In such a case, the inverted-T-shaped contact may be a first inverted-T-shaped contact self-aligned, at least in part, to the T-shaped gate, and forming the transistor may include providing a second inverted-T-shaped contact also self-aligned, at least in part, to the T-shaped gate on an opposite side of the T-shaped gate. In an alternate implementation, forming the T-shaped gate may include forming a horizontal portion of the T-shaped gate over a vertical portion of the T-shaped gate, where the horizontal portion extends asymmetrical laterally out from the vertical portion of T-shaped gate. In such a case, the inverted-T-shaped contact may be a first contact self-aligned, at least in part, to the T-shaped gate, and forming the transistor may further include providing a second contact that is non-self-aligned to the T-shaped gate on an opposite side of the gate.

Reference is made below to the drawings, which are not drawn to scale for ease of understanding, wherein the same reference numbers used throughout different figures designate the same or similar components.

FIG. 1A illustrates one embodiment of an intermediate multi-layer structure, generally denoted 100, obtained during fabrication of one or more semiconductor devices, in accordance with one or more aspects of the present invention. At the point of fabrication, depicted in FIG. 1A, intermediate structure 100 includes a substrate 102, such as a bulk semiconductor material, for example, a bulk silicon wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like. Substrate 102 may in addition or instead include various isolations, dopings and/or device features. The substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof. The substrate 102 may be a planar substrate, or three-dimensional, such as FINs or Nanowires.

Note that the intermediate structure 100 depicted in FIG. 1A, may be obtained during a replacement metal gate fabrication process and represents one embodiment of a structure obtained after the sacrificial gate material and thin oxide layer underlying the sacrificial gate material have been removed. One skilled in the art will note that a thin oxide layer (also referred to as pad oxide) (not shown) is typically disposed over substrate 102, to protect the substrate during subsequent processing. A sacrificial gate material (also not shown), such as, for example, amorphous-silicon, may also be provided over the thin oxide layer, to hold the gate position for subsequent metal gate electrodes to be formed. A portion of the thin oxide layer and sacrificial gate material may be patterned using conventional etching processes, to define a sacrificial gate structure (not shown). The etching processes may include conventional anisotropic dry etching processing, for example, reactive ion etching or isotropic wet etching processes.

To obtain the structure depicted in FIG. 1A, a first sidewall spacer 110 is provided (in one embodiment) along the sacrificial gate structure (not shown). These first sidewall spacers 110 are thin film layers (or spacers) formed along the sidewalls of the sacrificial gate structure. First sidewall spacers 110 may be deposited using conventional deposition processes, such as, for example, chemical vapor deposition (CVD), low-pressure CVD, or plasma-enhanced CVD (PE-CVD). In one example, first sidewall spacers 110, may have a conventional thickness and include or be fabricated of a material such as, for example, silicon nitride. In a specific example, silicon nitride may be deposited using process gases such as, for example, dichlorosilane ($SiH_2Cl_2$) and ammonia ($NH_3$) and using known process conditions. In another example, silicon nitride may also or alternatively be deposited using halogen-free precursor such as, for example, bis(t-butylamino)silane (BTBAS) ($SiC_8N_2H_{22}$) and ammonia ($NH_3$) at about 550° C. It should be noted that, in one example, the dielectric constant of first sidewall spacers 110 may be about 7.

A source and drain region (hereafter referred to as active region 104) is provided over substrate 102. Active region 104 may be formed using any suitable techniques, including, for example, ion implantation, epitaxial growth of the embedded source/drain materials and activation anneals.

An inter-layer dielectric 106 is then disposed over active region 104. As one example, inter-layer dielectric 106 may be a field oxide such as, flowable oxide, of relatively low quality within the spectrum of available oxides. In another example, inter-layer dielectric 106 may include, but not be limited to, silicon nitride (SiN), silicon nitride ($Si_3N_4$), silicon oxide ($SiO_2$), fluorinated silicate glass (FSG). As noted further below, the height of the resultant T-shaped gate(s) may correlate, in one embodiment, to the thickness of inter-layer dielectric 106. A non-selective chemical-mechanical polish may be employed to polish away excess inter-layer dielectric layer 106, with the chemical-mechanical polishing terminating at, for instance, sacrificial gate structure (not shown), resulting in the height of inter-layer dielectric 106 being substantially equal to the height of the sacrificial gate structures (not shown).

The sacrificial gate structures (not shown), including the sacrificial gate material and thin oxide layer, are subsequently, selectively removed using one or more etching processes to form one or more openings 108, which results in the structure illustrated in FIG. 1A. Any suitable etching process, such as anisotropic dry etching processing, for example, reactive to ion etching, may be employed to selectively remove the sacrificial gate structures to define openings 108.

Figure 1B:
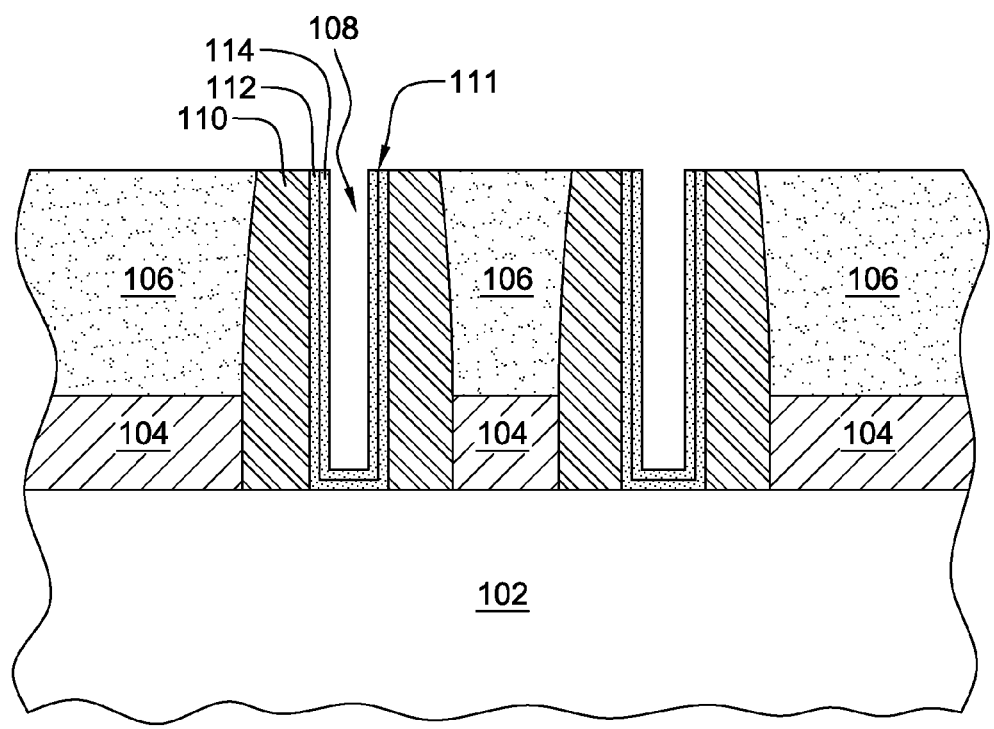
FIG. 1B depicts the intermediate structure of FIG. 1A after one or more gate liners have been provided within the openings, in accordance with one or more aspects of the present invention.

As depicted in FIG. 1B, in one embodiment, the gate formation process includes depositing within openings 108 one or more gate liners 111, for instance, using conventional deposition processes. As used herein "gate liners" refers generally to any film or layer which may form part of the resultant gate structure, and includes one or more conformally-deposited layers, such as a gate dielectric layer 112, and/or one or more work function layers 114 disposed over gate dielectric layer 112. Note that these layers may be formed using a variety of different materials and techniques, such as, for example, atomic layer deposition (ALD) and chemical vapor deposition (CVD). The thickness of the layers may also vary, depending upon the particular application.

As one example, gate dielectric layer 112 may be formed of a material such as silicon dioxide or a high-k dielectric material with a dielectric constant k greater than about, for instance, 3.9 (note that k=3.9 for $SiO_2$), and may be deposited by performing a suitable deposition process, such as atomic layer deposition (ALD), chemical vapor deposition (CVD), physical vapor deposition (PVD), or the like. Examples of high-k dielectric materials which may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. As noted, one or more work-function layers 114 may be conformally deposited over gate dielectric layer 112, for example, via a deposition process such as ALD, CVD or PVD. The work-function layer(s) 114 may include, for instance, one or more α-type metals or one or more N-type metals, depending on whether the gate structure is part of, for instance, a P-type field-effect transistor (PFET) or an N-type field-effect transistor (NFET). Work-function layer(s) 114 may include an appropriate refractory metal nitride, for example, those from Groups IVa-VIa in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like. The thickness of dielectric layer 112 may be about 10 to 25 Å, and the thickness of work function layers 114 may vary from about 20 to 90 Å.

Figure 1C:
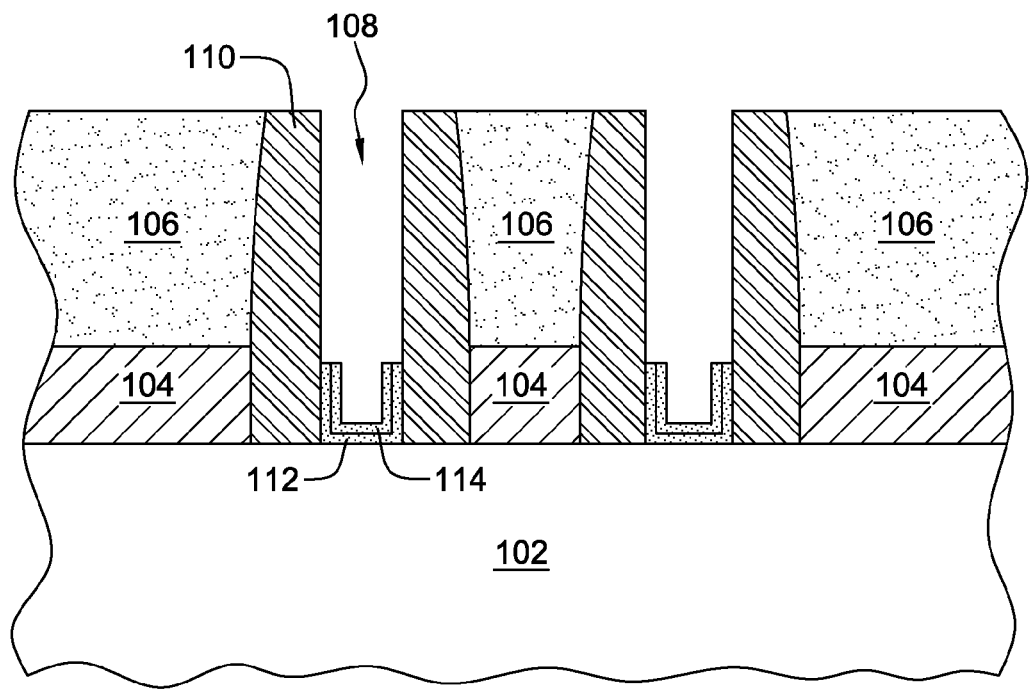
FIG. 1C depicts the intermediate structure of FIG. 1B after partial recessing of the gate liners within the openings, in accordance with one or more aspects of the present invention.

Next, as illustrated in FIG. 1C, one or more processes are performed on the gate liners 111, to partially recess the gate liners within the openings 108, without affecting the adjacent first sidewall spacers 110. In this example, recessed gate liners 111, include recessed gate dielectric layer 112 and the recessed one or more work function layers 114. In one example, the processes include depositing a sacrificial material (such as oxide or optical dispersion layer (ODL)) to fill the recessed gate liners 111, then partially recessing the sacrificial material by dry-etch, followed by removal of top exposed liners 111 by dry or wet process. In a specific example, exposed gate dielectric layer 114, such as titanium nitride (TiN) may be removed using SC1 solution and exposed one or more work function layer 112 such as, hafnium oxide (NPO$_2$) may be subsequently etched using chlorine-based dry etch. By way of example, the resultant height of the recessed gate liners 111 may be about 10 nanometers to about 25 nanometers.

Figure 1D:
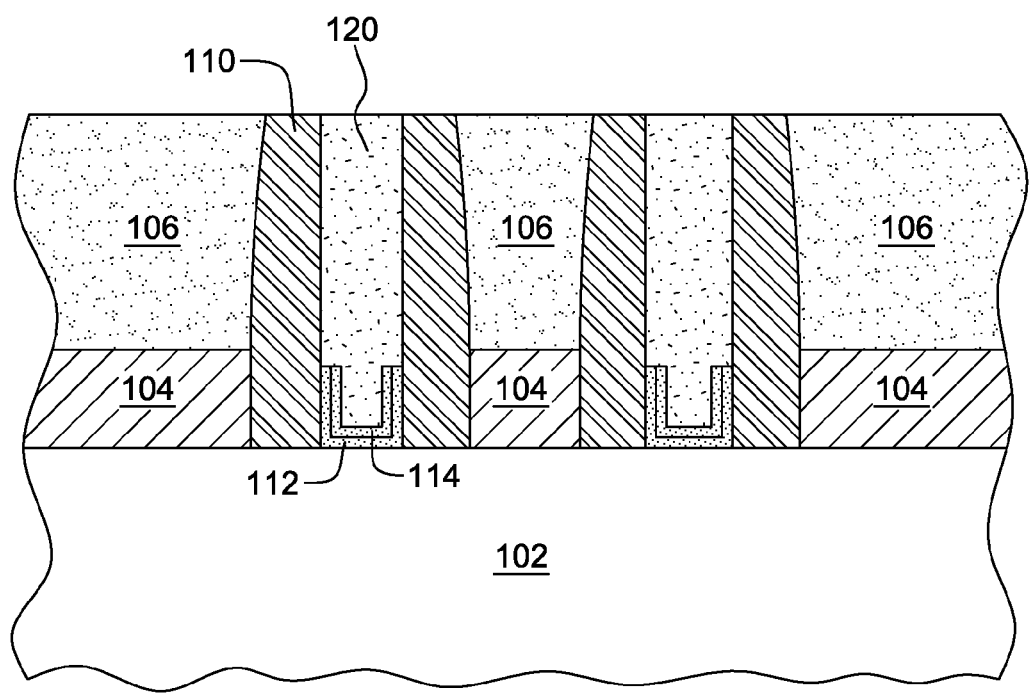
FIG. 1D depicts the intermediate structure of FIG. 1C with a sacrificial gate material having been provided over the recessed gate liners, in accordance with one or more aspects of the present invention.

As depicted in FIG. 1D, a sacrificial gate material 120 is provided over recessed gate liners 111 within openings 108. This sacrificial gate material 120 may include, for instance, an amorphous-silicon (a-Si) or a polysilicon material to hold, in one embodiment, the gate position for the subsequent metal gate electrodes to be formed, using (for instance) a gate-last processing approach. A non-selective chemical-mechanical polish may be employed to polish away excess sacrificial gate material 120, with the chemical-mechanical polishing terminating at first sidewall spacers 110, resulting in the height of the sacrificial gate material 120 being substantially equal to the height of first sidewall spacers 110 of the intermediate structure.

Figure 1E:
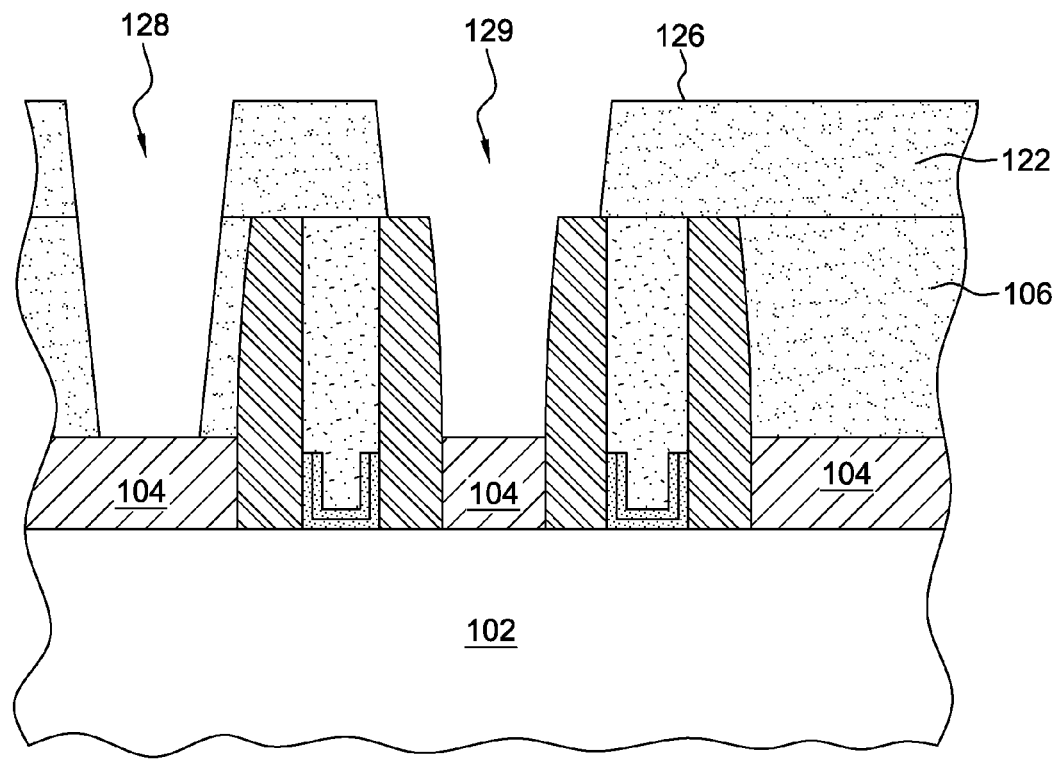
FIG. 1E depicts the intermediate structure of FIG. 1D after patterning and creating one or more contact openings, including (by way of example) at least one self-aligned contact opening therein aligned to the gate structure, in accordance with one or more aspects of the present invention.

As illustrated in FIG. 1E, a sacrificial layer 122 may subsequently be provided, for example, by conformal deposition over inter-layer dielectric 106. By way of example, sacrificial layer 122 may be deposited to a thickness in the range of about 30 nms to about 60 nms. This sacrificial layer advantageously facilitates patterning of the structure to create contact openings, such as contact openings 128, 129. These contact openings 128, 129 facilitate formation of the conductive contacts or contact metallization to electrically connect to (for example) the active regions of the transistor. In this example, contact opening 129 is self-aligned to adjacent gate structures and extends between the illustrated, adjacent gate structures, while contact opening 128 is a non-self-aligned opening spaced a greater distance from the adjacent gate structure. In one example, contact openings 128 and 129 may be formed using any suitable etching process, such as anisotropic dry etching, for instance, reactive-ion-etching. In one specific example, reactive ion etching (RIE) may be performed using fluorine-based chemistry and involve process gases such as tetrafluoromethane (CF$_4$), trifluoromethane (CHF$_3$), difluoromethane (CH$_2$F$_2$), fluoromethane (CH$_3$F), octafluorocyclobutane (C$_4$F$_8$), hexafluoro-1,3-butadiene (C$_4$F$_6$) and oxygen (O$_2$). In another example, an isotropic wet etching process using known wet etching solutions, may also be employed to form the contact openings 128, 129.

Figure 1F:
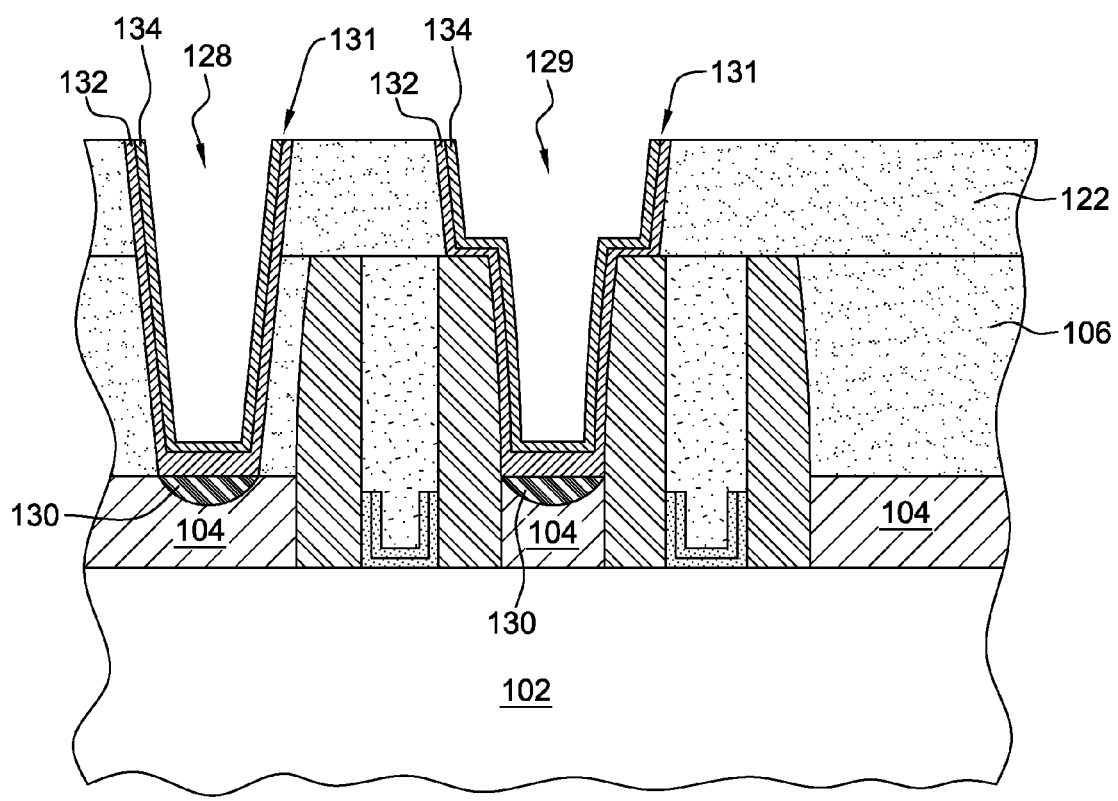
FIG. 1F depicts the intermediate structure of FIG. 1E with one or more contact liners provided within the one or more contact openings, in accordance with one or more aspects of the present invention.

Next, referring to FIG. 1F, a silicide 130 is formed within the active region(s) 104 defining a part of the source and/or drain regions of the transistor. The silicide 130 may be formed from a refractory metal, such as, for example, cobalt, nickel, titanium, tantalum, platinum, palladium, rhodium and mixtures thereof that have been chemically reacted with the silicon of active region 104 exposed within contact openings 128, 129.

In one embodiment, if the contact metal (or conductive contact) is to comprise tungsten, which has poor adhesion to the underlying layers, contact openings 128, 129 may be lined with one or more contact liners 131. As used herein "contact liners" refers generally to any film or layer which may form part of the resultant contact structure, and may include one or more conformally-deposited high resistive contact liners, such as a gettering layer 132, and a barrier/adhesive layer 134 disposed over gettering layer 132. Gettering layer 132 may be deposited, to ensure that oxygen (for instance, formed due to exposure of the underlying silicide to ambient conditions), remaining after various post pre-clean conditions such as, for example, argon (Ar) sputter, SiCoNi dry etch conditions, is gettered of the underlying silicide layer and also to decrease subsequent contact resistance. Gettering layer 132, which may be deposited using conventional process(es) such as, for example, ionized metal plasma (IMP), or physical vapor deposition processes, for example, radio-frequency physical vapor deposition (RFPVD), may have a thickness of about 2 nanometers to about 8 nanometers, and be fabricated of, for example, ruthenium (Ru), an alloy of ruthenium, cobalt (Co), an alloy of cobalt, titanium (Ti), an alloy of titanium, tantalum (Ta), an alloy of tantalum, palladium (Pd), rhodium (Rh), molybdenum (Mo) and the like.

Barrier/adhesive layer 134 may be deposited over gettering layer 132 to, for instance, protect the gettering layer from eroding on exposure to harsher chemistries typically employed during subsequent contact metallization, as well as to prevent oxidation due to exposure to air. Barrier/adhesive layer 134 may be deposited using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods, and have a thickness of about 1 nanometers to about 3 nanometers. In one example, barrier/adhesive layer 134 may include, titanium-based materials (e.g., TiN, TiC, TiCN, TiSiN), or tantalum-based materials (e.g., TaN, TaC, TaCN, TaSiN) or fluorine-free tungsten-based materials (e.g., WN, WC, WCN, WSiN). It should be noted that the use of a fluorine-free tungsten-based nucleation layer may eliminate the need for additional adhesive layers such as, for example, titanium-based materials (e.g., TiN), as fluorine-free tungsten-based nucleation layers are known in the art to be good barrier/adhesive layers as well. In a specific example, titanium nitride (TiN) may be formed using a titanium precursor, such as, for example, tetrakis(dimethylamino) titanium (TDMAT) or titanium tetrachloride (TiCl$_4$) and a reagent plasma, such as, for example, nitrogen plasma during a plasma-enhanced ALD (PE-ALD) process.

Figure 1G:
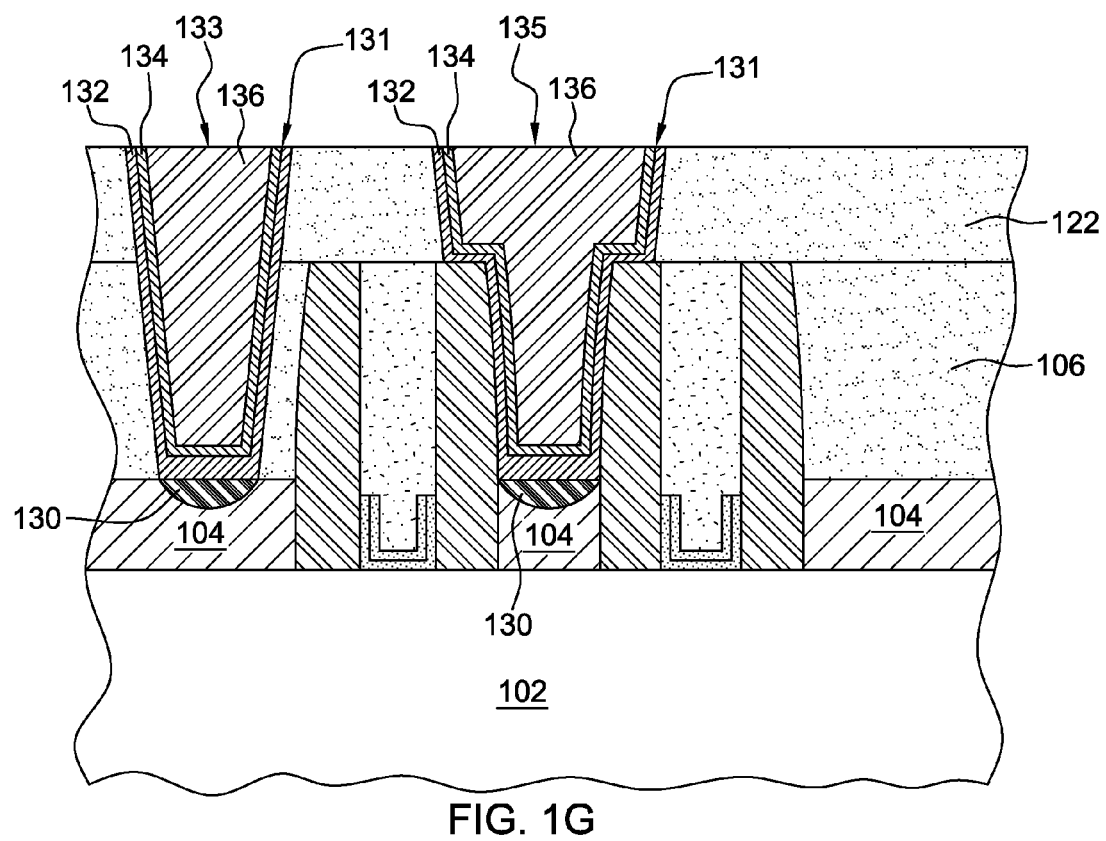
FIG. 1G depicts the intermediate structure of FIG. 1F with conductive contacts provided within the one or more contact openings, in accordance with one or more aspects of the present invention.

In FIG. 1G, a conductive contact material 136 has been provided over contact liners 131 (within contact openings 128, 129 (FIG. 1F)), resulting in contact structures 133 and 135. In this example, note that contact structure 133 is a non-self-aligned contact spaced a greater distance from the adjacent gate structure, while contact structure 135 is a self-aligned contact to the adjacent gate structures and extends between the depicted adjacent gate structures. Note also that conductive contact material 136 may be any of a variety of conductive materials, such as tungsten, copper, aluminum, etc. In the example discussed herein, it is assumed that the conductive contact material is tungsten.

In one example of the process, a tungsten nucleation layer (not shown) may be deposited over the adhesive/barrier layer 134 to facilitate the subsequent formation of the bulk tungsten material, using conventional deposition processes such as chemical vapor deposition (CVD), atomic layer deposition (ALD) or pulsed nucleation layer deposition (PNL) deposition processes. The thickness of the nucleation layer may be about 1 nm to about 4 nm and may be deposited by, for instance, performing alternating pulsing sequences of boron-containing reducing agent and tungsten-containing precursor in presence of a reducing agent. The boron-containing reducing agents include, but are not limited to borane (BH$_3$), diborane (B$_2$H$_6$), triborane, boron halides such as, for example, boron trifluoride (BF$_3$), boron trichloride (BCl$_3$) and the like. The tungsten-containing precursors may include tungsten-containing gases such as, for example, WF$_6$, WCl$_6$ and W(CO)$_6$ and the like, while the reducing agents may include hydrogen gas (H$_2$), silane (SiH$_4$), disilane (Si$_2$H$_6$), hydrazine (N$_2$H$_4$) and germane (GeH$_4$). In a specific example, the bulk deposition process involves a chemical vapor deposition (CVD) reaction of tungsten-containing precursor, such as tungsten hexafluoride ($WF_6$), and reducing gases, such as hydrogen ($H_2$) to produce tungsten and a by-product, such as for example, hydrogen hexafluoride (HF) at temperature of about 250° C. to about 400° C.

Figure 1H:
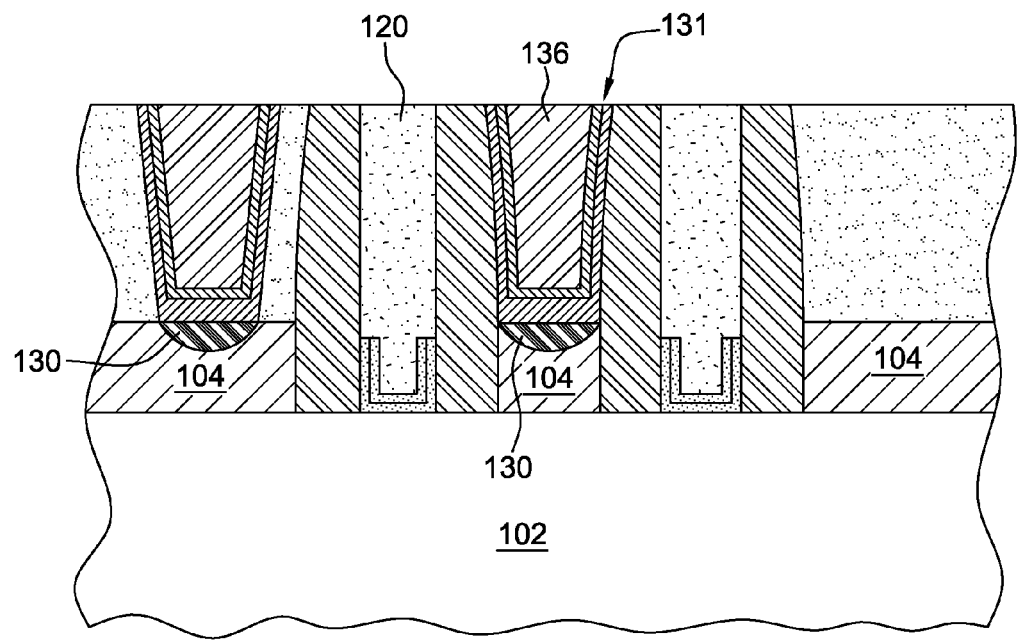
FIG. 1H depicts the intermediate structure of FIG. 1G after planarization thereof, in accordance with one or more aspects of the present invention.

As depicted in FIG. 1H, a non-selective chemical-mechanical polish may be employed to polish away excess contact liners 131 and excess conductive contact material 136, along with sacrificial layer 122 with the chemical-mechanical polishing terminating at, for instance, sacrificial gate material 120, resulting in the height of the contact structures being substantially equal to the height of the gate structures as illustrated.

Figure 1I:
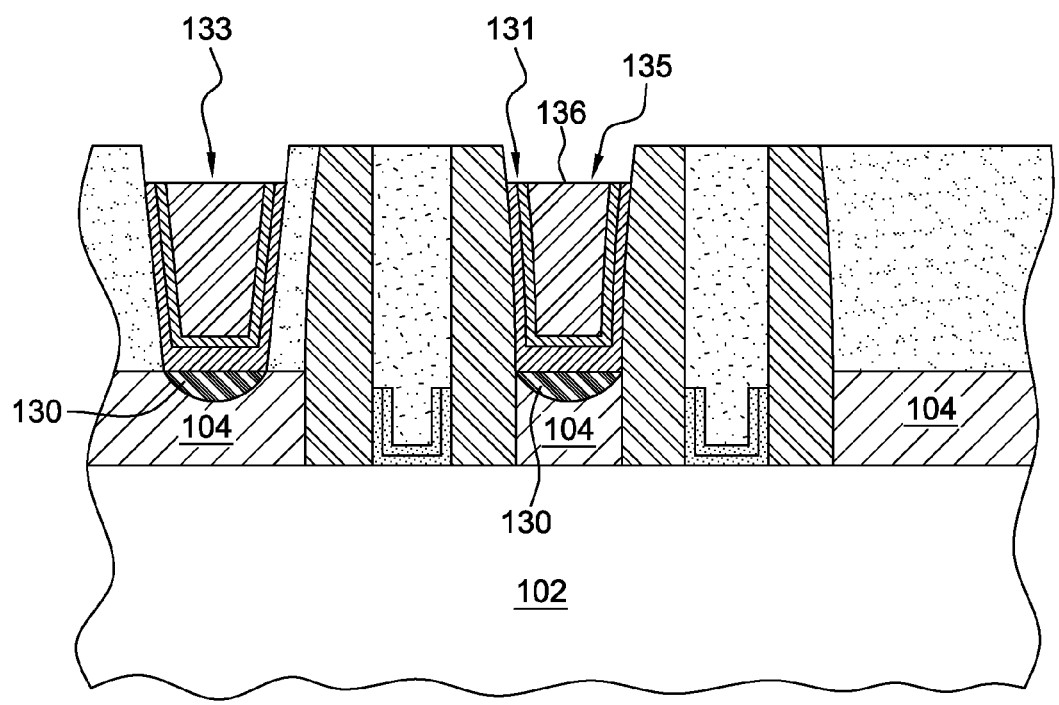
FIG. 1I depicts the intermediate structure of FIG. 1H after partial recessing of the conductive contacts and contact liners, in accordance with one or more aspects of the present invention.

FIG. 1I depicts the intermediate structure of FIG. 1H after further processing to recess the contact structures 133 and 135, and in particular, contact liners 131 and conductive contact 136. In one example, the contact structures may be recessed to a height of about 10 nm to 20 nm, and be using a conventional anisotropic dry etching process. In one example, contact structures 133 and 135 may be selectively etched using, for instance, activated fluorine radicals generated from nitrogen trifluoride ($NF_3$) and argon (Ar) or helium (He) plasma in a remote plasma source. Note that, in one instance, selective etching of the contact liners and the conductive contact may be controlled by ambient conditions such as temperature and be based on the difference in activation energies for fluorine (F)—radical etch of tungsten and titanium/titanium nitride layers.

Figure 1J:
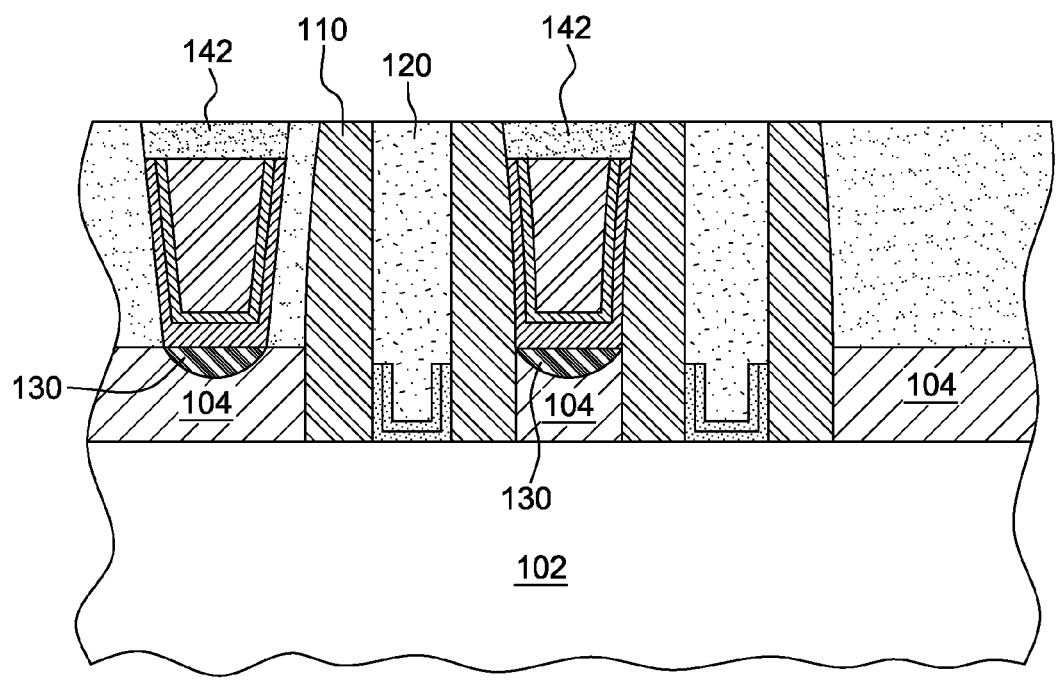
FIG. 1J depicts the intermediate structure of FIG. 1I with protective caps provided over the recessed conductive contacts and contact liners, in accordance with one or more aspects of the present invention.

As depicted in FIG. 1J, protective caps 142 are formed, for instance, by conformal deposition within the contact recesses. These protective caps 142 may include a material such as, for example, conventional oxide which is formed by CVD deposition. After deposition, the protective caps 142 are polished back using, for example, chemical-mechanical polishing, again stopping on first sidewall spacers 110 and sacrificial gate material 120.

Figure 1K:
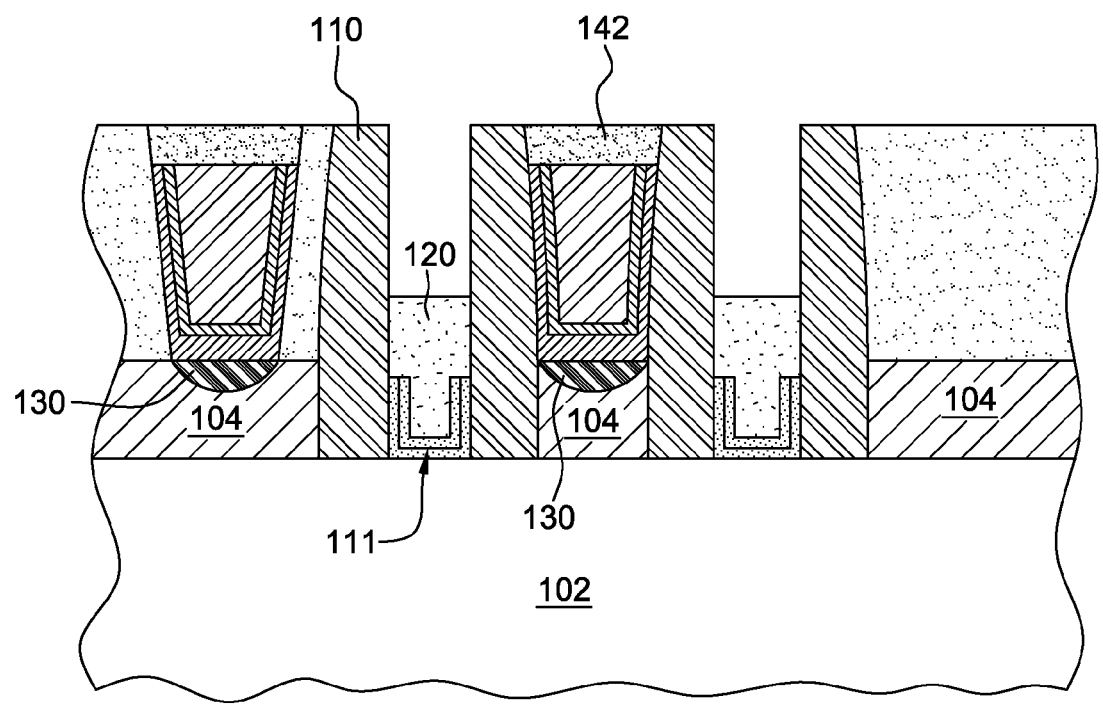
FIG. 1K depicts the intermediate structure of FIG. 1J after partial recessing of the sacrificial gate material, in accordance with one or more aspects of the present invention.

Referring to FIG. 1K, one or more etching processes are performed on the sacrificial gate material 120 to partially recess the sacrificial gate material, without affecting the adjacent first sidewall spacers 110. In one example, the height of the sacrificial gate material 120 may be recessed about 50 nm to 100 nm, using a conventional anisotropic dry etching process or isotropic wet etching process. For instance, isotropic wet etching may be performed using wet etchants such as, for example, ammonium hydroxide or HF: Nitric acid: Acetic acid solution (also HNA etch). It may be noted that the sacrificial gate material 120 is partially recessed so as to protect the underlying gate liners 111 such as, the gate dielectric layer and the one or more work function layers, during subsequent fabrication processing.

Figure 1L:
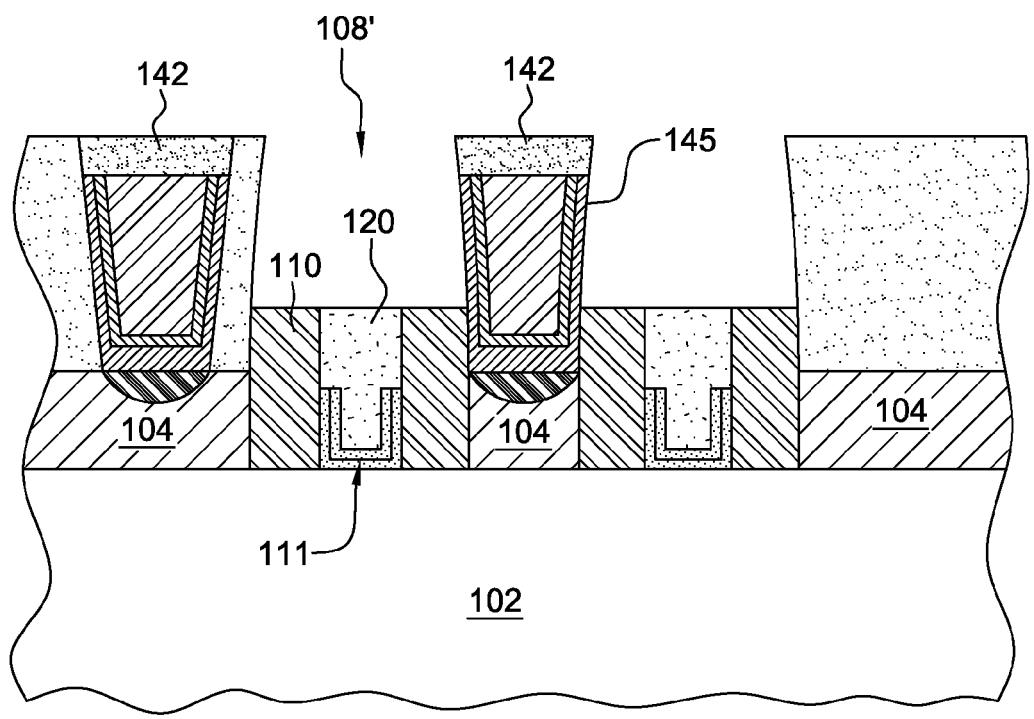
FIG. 1L depicts the intermediate structure of FIG. 1K after partial recessing of the first sidewall spacers, in accordance with one or more aspects of the present invention.

As illustrated in FIG. 1L, the first sidewall spacers 110 are partially recessed to, at least in part, partially expose the vertical sidewalls of contact liners 145 of the self-aligned contact structure(s), resulting in one or more openings 108' about the self-aligned contact(s). First sidewall spacers 110 may be recessed using conventional isotropic or anisotropic dry-etching processes such as, reactive ion etching or plasma etching. In one specific example, reactive ion etching may be performed using remote plasma involving process gases such as nitrogen trifluoride ($NF_3$) and hydrogen ($H_2$). The first sidewall spacers 110 may be recessed to a height substantially equal to the height of the recessed sacrificial gate material, for instance, to a height of about 40 nm to about 70 nm above the top of 102.

Figure 1M:
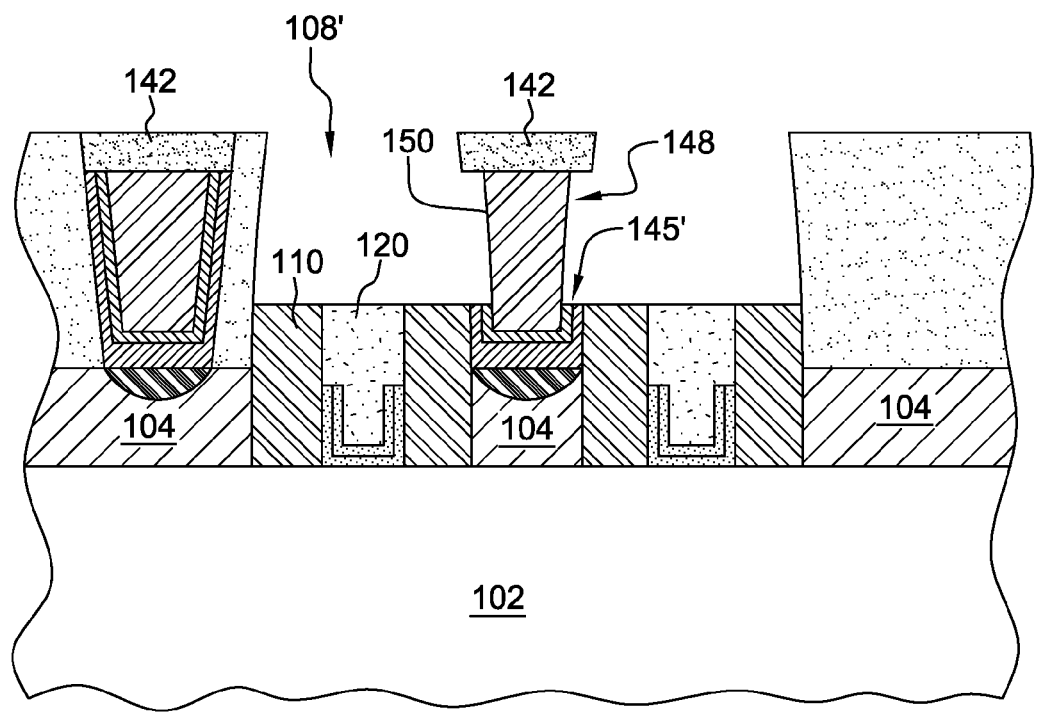
FIG. 1M depicts the intermediate structure of FIG. 1L after etching of the contact liners along the sidewalls of the self-aligned contact structure to expose the sidewalls of the conductive contact, in accordance with one or more aspects of the present invention.

As depicted in FIG. 1M, the exposed contact liners 145 (see FIG. 1L) are selectively removed by a selective etch process, to create undercut regions 148, for instance, partially undercutting the protective caps 142 disposed over the contact structures. It may be noted that this undercutting of the protective caps is selective to the exposed contact liners 145 (see FIG. 1L) of the self-aligned contact structures and terminates at the unexposed contact liners 145' of the self-aligned contact structure(s). The result is a recessing of the sidewall spacers about the sidewalls of the self-aligned contact structure(s), which exposes the sidewalls of the self-aligned conductive contact 150. The selective etch process may utilize one or more isotropic wet process, such as not nitric acid or, dry-etch processes, which may include reactive ion etching that may be performed using remote plasma involving fluorine- and/or chlorine-containing process gases, with the fluorine-containing process gases being more advantageous in one embodiment. In a specific example, fluorine-containing reactive gases may include $NF_3$ (nitrogen trifluoride), $ClF_3$ (chlorine trifluoride), ClF (chlorine monofluoride), $BF_3$ (boron trifluoride), perfluorocarbons such as $CF_4$ and $C_2F_6$ and the like, hydrofluorocarbons such as $CHF_3$ and the like, oxyfluorocarbons such as $C_4F_8O$ (perfluorotetrahydrofuran) and $CF_3OF$ (fluoroxytrifluoromethane), $COF_2$ and the like. Note also that non-self-aligned contact structure 133 spaced at a greater distance to the adjacent gate structure remains undisturbed during this aspect of the fabrication process.

Figure 1N:
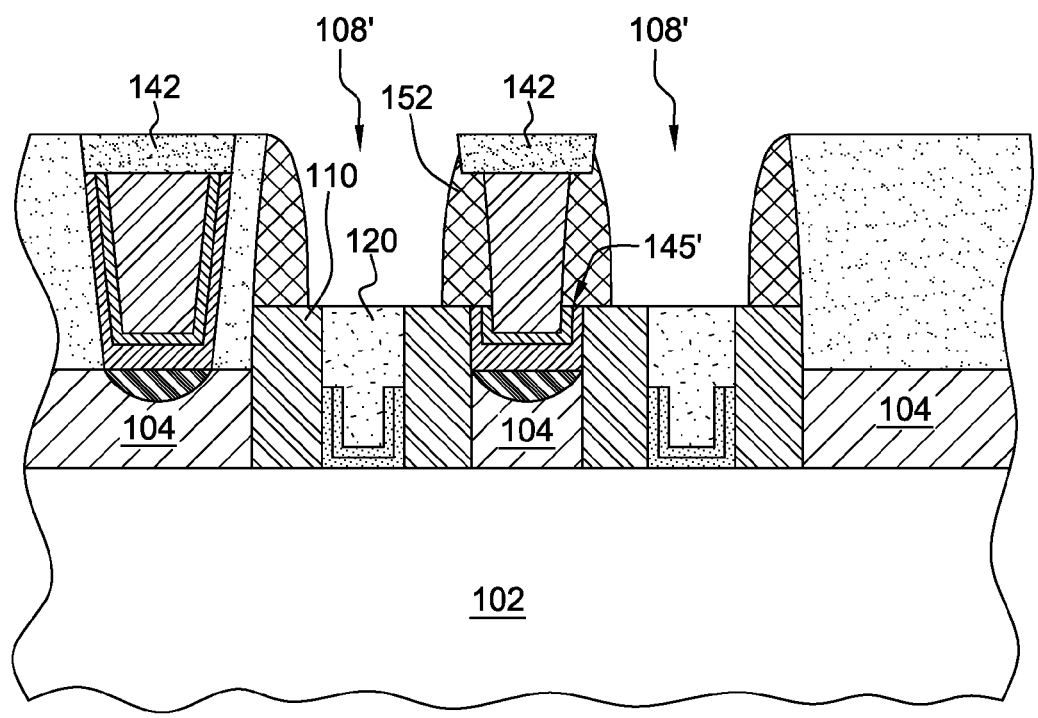
FIG. 1N depicts the intermediate structure of FIG. 1M with a second sidewall spacer provided over, at least in part, the exposed sidewalls of the conductive contact, in accordance with one or more aspects of the present invention.

As illustrated in FIG. 1N, a second sidewall spacer material is provided (in one embodiment) within openings 108' above (in part) contact liners 145' and, at least partially, over a portion of the recessed first sidewall spacers 110. It may be noted that the second sidewall spacer material, in one embodiment, fills the undercut regions 148 (see FIG. 1M) and provides a sidewall spacer 152 over the exposed sidewall of the conductive contact 150 (see FIG. 1M). As will be understood from the following discussion, the second sidewall spacer will be, in one embodiment, a reverse sidewall spacer to the resultant gate electrode, in that the upper regions of the spacer curves away from the center of the respective gate opening 108'.

In one example, the second sidewall spacer 152 may be fabricated of or include a material which has a dielectric constant less than the dielectric constant of first sidewall spacer 110. The lower dielectric constant of the second sidewall spacer facilitates reducing the capacitance of the contact structures, which in turn, facilitates improving performance of the resultant transistor. As noted above in connection with FIG. 1A, the dielectric constant of the first sidewall spacer such as, silicon nitride, is (in one example) about 7. In one embodiment, second sidewall spacer 152 may be a material such as a medium-k dielectric sidewall spacer (where k, the dielectric constant value, is in the range of about 3.0 to about 6.0, while typically in the range of about 4.0 to about 5.0), a low-k dielectric sidewall spacer (where the dielectric constant value is less than 2.7), or an ultra-low-k dielectric sidewall spacer (the dielectric constant value is less than 2.3). In one example, second sidewall spacer 152 may include dense or porous materials such as, for example, silicon dioxide ($SiO_2$), nitrogen doped silicon carbide (SiCN), fluorine-doped amorphous silicon-oxycarbide (SiCOF), silicon oxycarbide (SiCO), silicon nitride-boron carbide ($Si_3N_4$—$B_4C$), porous SiLK (available from Dow Chemical, Midland, Mich.), and JSR5108 or JSR 5109 or LKD (available from JSR), BLACK DIAMOND or BLACK DIAMOND II (available from Applied Materials), CORAL (available from Novellus), mesoporous organosilicate glass (OSG), BCB (divinylsiloxane bisbenzocyclobutene) and silicon-carbon-oxygen-hydrogen (SiCOH) organic dielectrics.

Figure 1O:
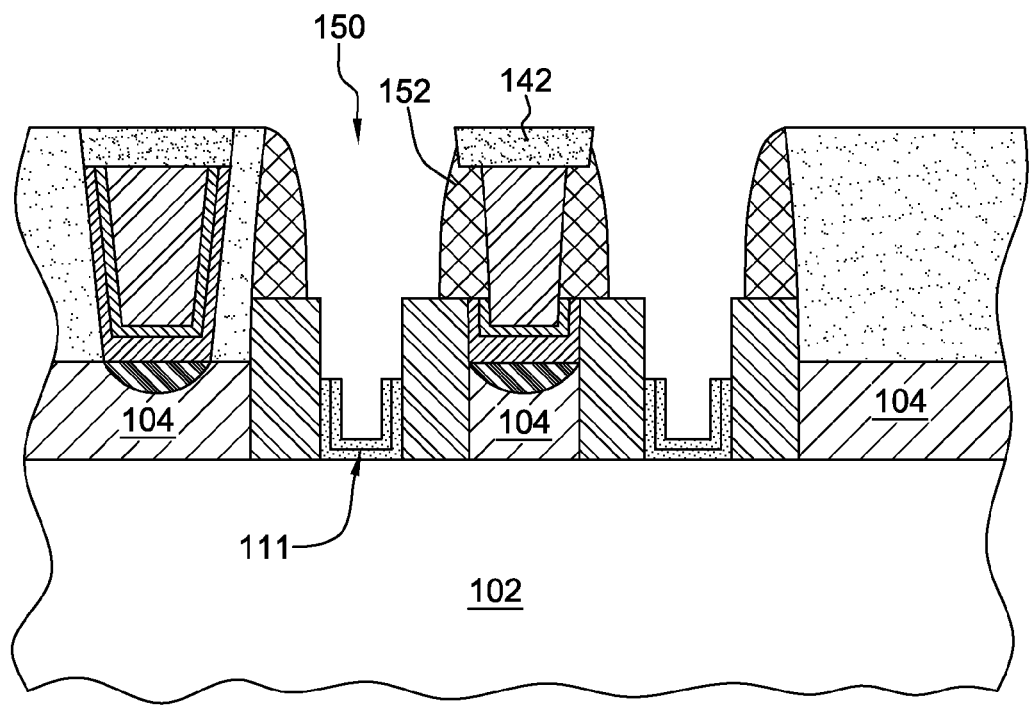
FIG. 1O depicts the intermediate structure of FIG. 1N after removal of the recessed sacrificial gate material, in accordance with one or more aspects of the present invention.

As illustrated in FIG. 1O, the recessed sacrificial gate material 120 (of FIG. 1P), overlying the recessed gate liners 111, and holding the gate position for the subsequent metal gate electrode to be formed, is removed using any suitable conventional etching process(es). In one example, the recessed sacrificial gate material may be removed using a conventional anisotropic dry etching process or an isotropic wet etching process. In one example, isotropic wet etching may be performed using wet etchants such as, for example, ammonium hydroxide or HF: Nitric acid: Acetic acid solution (also HNA etch). In an alternate example, reactive ion etching or plasma etching may also be employed to remove the recessed sacrificial gate material.

Figure 1P:
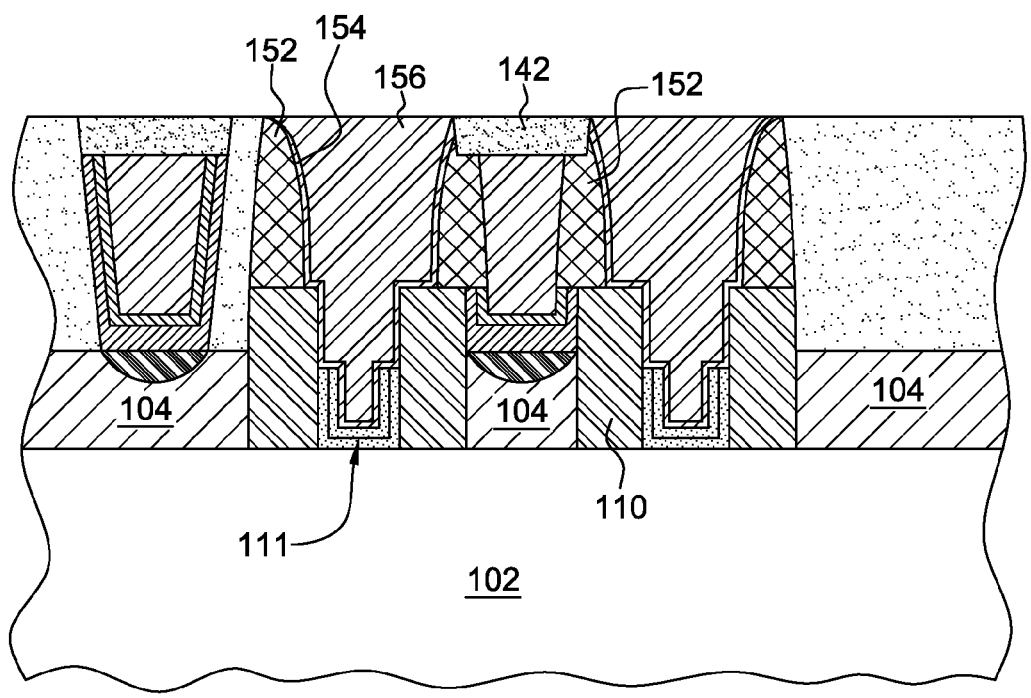
FIG. 1P depicts the intermediate structure of FIG. 1O with a gate material having been provided over the recessed gate liners, in accordance with one or more aspects of the present invention.

FIG. 1P depicts the structure of FIG. 1O with gate material 156 having been provided over the recessed gate liners 111. Note that a portion of gate material 156 overhangs, in this example, a portion of recessed first sidewall spacers 110 and resides adjacent to second sidewall spacer 152. Gate material 156 may be any of a variety of metal gate electrode materials, such as, tungsten (W), aluminum (Al), nickel (Ni), cobalt (Co) and titanium (Ti) and may be conformally deposited over recessed gate liners 111 using processes such as, for instance, ALD or CVD. In the one embodiment, the metal gate electrode employed may be tungsten, which has poor adhesion to the underlying layers, so a barrier/adhesive layer or liner 154 may also be provided. Barrier/adhesive layer 154 may be deposited using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods, and have a thickness of about 1 nanometers to about 3 nanometers. In one example, the barrier/adhesive layer 154 may include, titanium-based materials (e.g., TiN, TiC, TiCN, TiSiN), or tantalum-based materials (e.g., TaN, TaC, TaCN, TaSiN) or fluorine-free tungsten-based materials (e.g., WN, WC, WCN, WSiN). In a specific example, tantalum nitride (TaN) may be formed by sequentially exposing the substrate to pentakis (dimethylamino) tantalum (PDMAT) and ammonia ($NH_3$) during an ALD process or a PE-ALD process.

In one implementation, providing agate material 156 may include providing a tungsten nucleation layer (not shown) deposited over the adhesive/barrier layer 154 to facilitate the subsequent formation of the bulk tungsten material. This deposition may be achieved using conventional deposition processes such as chemical vapor deposition (CVD), atomic layer deposition (ALD) and pulsed nucleation layer deposition (PNL) deposition processes. The thickness of the nucleation layer may be about 1 nm to about 4 nm and, in one embodiment, may be deposited by performing alternating pulsing sequences of boron-containing reducing agent and tungsten-containing precursor in presence of a reducing agent. Boron-containing reducing agents include, but are not limited to borane ($BH_3$), diborane ($B_2H_6$), triborane, boron halides such as, for example, boron trifluoride ($BF_3$), boron trichloride ($BCl_3$) and the like. The tungsten-containing precursors may include tungsten-containing gases such as, for example, $WF_6$, $WCl_6$ and $W(CO)_6$ and the like, while the reducing agents may include hydrogen gas ($H_2$), silane ($SiH_4$), disilane ($Si_2H_6$), hydrazine ($N_2H_4$) and germane ($GeH_4$). In a specific example, the bulk deposition process involves a chemical vapor deposition (CVD) reaction of tungsten-containing precursor, such as tungsten hexafluoride ($WF_6$), and reducing gases, such as hydrogen ($H_2$) to produce tungsten and a by-product, such as for example, hydrogen hexafluoride (HF) at temperature of about 250° C. to about 400° C.

Figure 1Q:
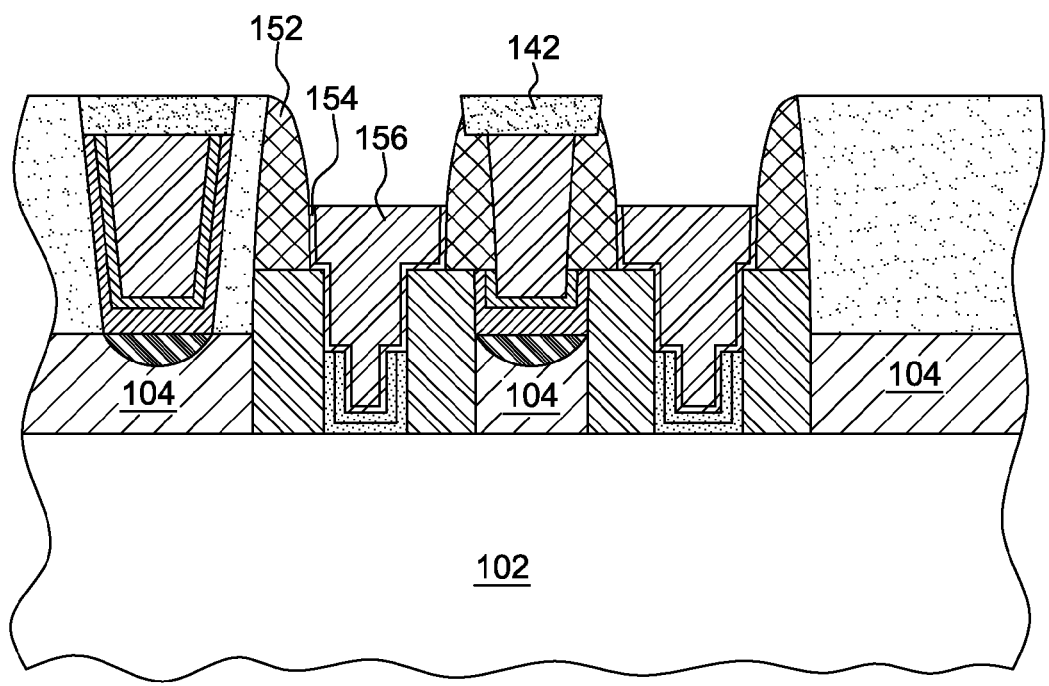
FIG. 1Q depicts the intermediate structure of FIG. 1P after partial recessing of the gate material, resulting in T-shaped gates (as highlighted in FIG. 1R), in accordance with one or more aspects of the present invention.
Figure 1R:
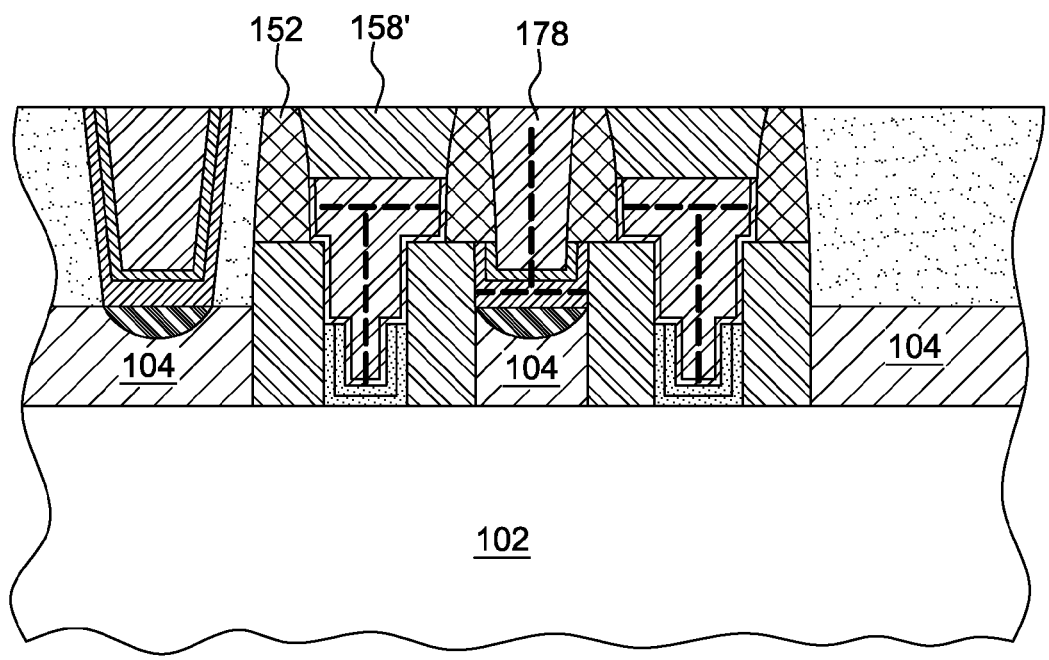
FIG. 1R depicts the semiconductor device of FIG. 1Q after gate caps have been provided over the T-shaped gates, in accordance with one or more aspects of the present invention.

As depicted in FIG. 1Q, one or more selective etching processes are performed on gate material 156 and adhesive/barrier layer 154 to partially recess the gate material and the liners. This partial recessing of the gate material and adhesive/barrier layers results in a roughly T-shaped gate being formed for the transistor, as illustrated in FIG. 1R. The selective etch process may be one or more anisotropic, dry-etch processes employed to partially recess the gate material 156. In a one example, the anisotropic, dry etching process may include, reactive ion etching that may be performed using remote plasma involving fluorine- and/or chlorine-containing process gases, with the fluorine-containing process gases being more preferred. In a specific example, fluorine-containing reactive gases may include $NF_3$ (nitrogen trifluoride), $ClF_3$ (chlorine trifluoride), ClF (chlorine monofluoride), $BF_3$ (boron trifluoride), perfluorocarbons such as $CF_4$ and $C_2F_6$ and the like, hydrofluorocarbons such as $CHF_3$ and the like, oxyfluorocarbons such as $C_4F_8O$ (perfluorotetrahydrofuran) and $CF_3OF$ (fluoroxytrifluoromethane), $COF_2$ and the like. The height of the partially recessed gate material 156 (and the partially recessed adhesive/barrier layer 154) may be about 40 nanometers to about 70 nanometers.

As illustrated in FIG. 1R, gate caps 158' may be conformally deposited within the gate recesses, over the recessed gate material and recessed metal liners such as, the adhesive/barrier layers. As is understood in the art, the gate cap material may be deposited to prevent short-circuiting, otherwise known as contact-to-gate (CTG) shorts, should the gate material come into contact with the conductive contact, during subsequent fabrication processing, as may happen occasionally in the case of self-aligned contacts. The gate cap material may, typically include an insulator material such as, silicon nitride and may be deposited using conventional deposition processes, such as, for example, CVD or plasma-enhanced CVD (PECVD). In one specific example, silicon nitride may be deposited using process gases such as, for example, dichlorosilane ($SiH_2Cl_2$) and ammonia ($NH_3$) and using known process conditions. The gate cap material is then polished back using, for instance, chemical-mechanical polishing, again stopping on the inverted-T-shaped contact to provide the desired gate caps 158'.

Note from FIG. 1R, the inverted-T-shaped profile of the contact structure in elevational cross-section, and that the vertical portion of the inverted-T-shaped contact includes the conductive contact, and the horizontal portion includes the unexposed contact liner. Note also that the inverted-T-shaped contact is disposed over, in this embodiment, the silicide associated with the active region. The inverted-T-shaped contact advantageously provides an increase in the cross-sectional area of the contact structure in electrical contact with the active region, which is important in determining the contact resistance, while simultaneously reducing the cross-sectional area needed for the vertical portion of the contact structure, with low resistance metal. This reduction in cross-sectional area maintains the low vertical resistance for contact, while increasing the cross-sectional area of gate metal. Note also from this figure that the gate is T-shaped in elevational cross-section, and that the horizontal portion of the T-shaped gate extends laterally over a vertical portion of the gate, with the horizontal portion of the gate overhanging, at least partially, a portion of the recessed first sidewall spacers and residing adjacent to second sidewall spacer. The T-shaped gate of the gate structure advantageously provides an increase in the cross-sectional area of the gate material and simultaneously provides a reduction in the resistance of the gate structure, and in particular, a reduction in the lateral resistance of the gate structure. Note also that the outer wall of second sidewall spacer is positioned away from the T-shaped gate and extends beyond an outer wall of the first sidewall spacer, that is, in a direction away from the T-shaped gate.

Figure 1S:
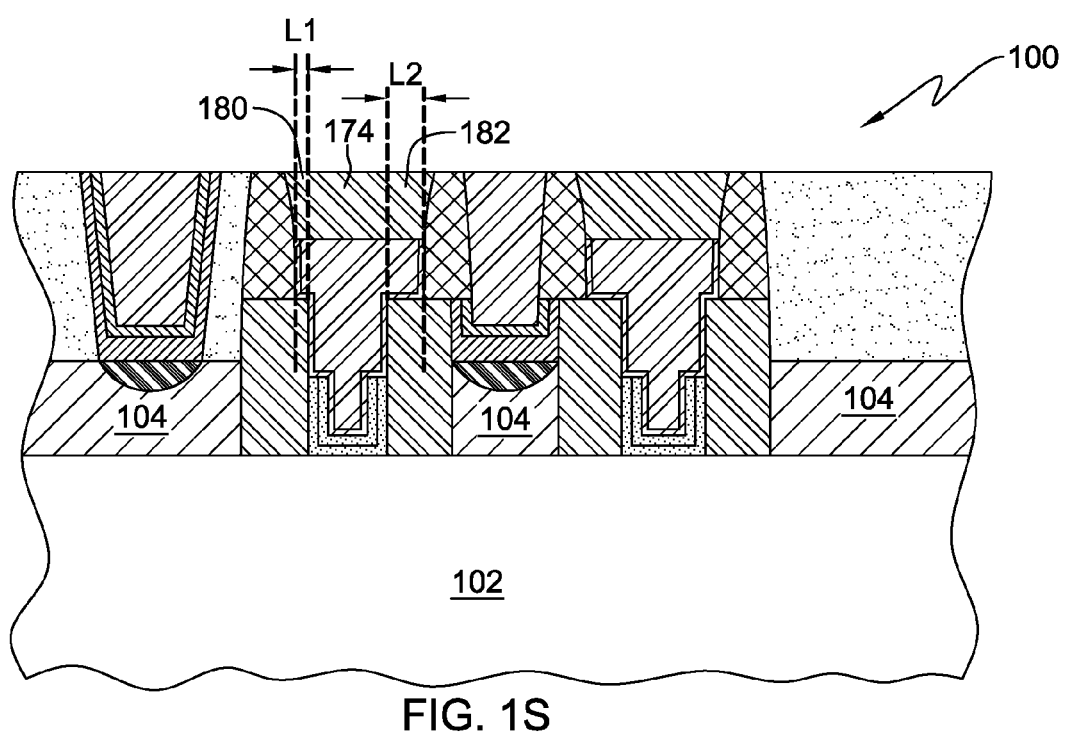
FIG. 1S depicts of semiconductor device of FIG. 1R with asymmetry of the horizontal portions of T-shaped gates noted in one example, in accordance with one or more aspects of the present invention.

FIG. 1S depicts the semiconductor device of FIG. 1R, and highlights, in one example, asymmetry of the horizontal portion of the T-shaped gate. In the depicted embodiment, there is a first inverted-T-shaped contact self-aligned, at least in part, to the T-shaped gate, and a second contact which is non-self-aligned to the T-shaped gate, on the opposite side of the T-shaped gate from the self-aligned contact. In this implementation, a horizontal portion 'L2' 182 of the gate extends laterally outward, to the right, a greater distance than a horizontal portion 'L1' 180 of the gate, which extends laterally outward, to the left.

In an alternate embodiment, the first and second contacts on the opposite sides of the T-shaped gate could both be self-aligned, inverted-T-shaped contacts. In such a case, the horizontal portion 'L2' 182 of the T-shaped gate extending to the right would substantially equal the horizontal portion 'L1' 180 extending to the left, meaning that the horizontal portion of the T-shaped gate would be substantially symmetrical over the vertical portion.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a semiconductor device, the providing comprising:
   forming a transistor of the semiconductor device, the forming comprising;
   forming a T-shaped gate for the transistor, the T-shaped gate being T-shaped in elevational cross-section; and
   forming an inverted-T-shaped contact to an active region of the transistor, the inverted-T-shaped contact comprising a conductive structure with an inverted-T-shape in elevational cross-section, wherein the inverted-T-shaped contact is self-aligned, at least in part, to the T-shaped gate.

2. The method of claim 1, wherein forming the transistor further comprises providing a sidewall spacer adjacent to the T-shaped gate of the transistor and at least partially separating the T-shaped gate and the inverted-T-shaped contact, and wherein a portion of the T-shaped gate extends over the sidewall spacer.

3. The method of claim 2, wherein the sidewall spacer is a first sidewall spacer and wherein forming the transistor further comprises providing a second sidewall spacer adjacent to the T-shaped gate and at least partially separating the T-shaped gate and the inverted-T-shaped contact of the transistor, the second sidewall spacer residing, at least partially, above the first sidewall spacer.

4. The method of claim 3, wherein forming the transistor further comprises providing the second sidewall spacer with an outer wall away from the T-shaped gate extending beyond an outer wall of the first sidewall spacer away from the T-shaped gate.

5. The method of claim 3, wherein the second sidewall spacer comprises a reverse sidewall spacer disposed adjacent to a sidewall of the T-shaped gate of the transistor.

6. The method of claim 3, wherein the first sidewall spacer comprises a first material and the second sidewall spacer comprises a second material, the first material and the second material being different materials, and wherein the second material has a dielectric constant less than that of the first material.

7. The method of claim 6, wherein the first material comprises a nitride and the second material comprises at least one of an oxide or a nitride.

8. The method of claim 6, wherein the dielectric constant of the second material is less than that of silicon nitride.

9. The method of claim 1, wherein forming the inverted-T-shaped contact comprises forming the conductive structure over and in electrical contact with a silicide, and the silicide residing over or comprising part of the active region, and the active region being one of a drain region or a source region of the transistor.

10. The method of claim 1, wherein forming the T-shaped gate comprises forming a horizontal portion of the T-shaped gate over a vertical portion of the T-shaped gate, the horizontal portion extending substantially symmetrically laterally out from the vertical portion of the T-shaped gate, and wherein forming the transistor further comprises providing another inverted-T-shaped contact, the another inverted-T-shaped contact also being self-aligned, at least in part, to the T-shaped gate of the transistor and being on an opposite side of the T-shaped gate from the inverted-T-shaped contact.

11. The method of claim 1, wherein forming the T-shaped gate comprises forming a horizontal portion of the T-shaped gate over a vertical portion of the T-shaped gate, the horizontal portion extending asymmetrical laterally out from the vertical portion of T-shaped gate, and wherein forming the transistor further comprises providing another contact, the another contact being non-self-aligned to the T-shaped gate of the transistor, and being on an opposite side of the T-shaped gate from the inverted-T-shaped contact.

12. A semiconductor device comprising:
a transistor, the transistor comprising;
a substrate;
a T-shaped gate disposed over the substrate, the T-shaped gate being T-shaped in elevational cross-section; and
an inverted-T-shaped contact to an active region of the transistor, the inverted-T-shaped contact comprising a conductive structure with an inverted-T-shape in elevational cross-section, wherein the inverted-T-shaped contact is self-aligned at least in part, to the T-shaped gate.

13. The semiconductor device of claim 12, further comprising a sidewall spacer disposed adjacent to the T-shaped gate and at least partially separating the T-shaped gate and the inverted-T-shaped contact, and wherein a portion of the T-shaped gate extends over the sidewall spacer.

14. The semiconductor device of claim 13, wherein the sidewall spacer is a first sidewall spacer and the semiconductor device further comprises a second sidewall spacer disposed adjacent to the T-shaped gate and at least partially separating the T-shaped gate and the inverted-T-shaped contact of the transistor, the second sidewall spacer residing, at least partially, above the first sidewall spacer.

15. The semiconductor device of claim 14, wherein the second sidewall spacer comprises an outer wall away from the T-shaped gate extending beyond an outer wall of the first sidewall spacer away from the T-shaped gate.

16. The semiconductor device of claim 15, wherein the first sidewall spacer comprises a first material and the second sidewall comprises a second material, the first material and the second material being different materials, and wherein the second material has a dielectric constant less than that of the first material.

17. The semiconductor device of claim 16, wherein the first material comprises a nitride and the second material comprises at least one of an oxide or a nitride.

18. The semiconductor device of claim 12, wherein the inverted-T-shaped contact comprises the conductive structure residing over and in electrical contact with a silicide, the silicide residing over or comprising part of the active region, and the active region being one of a drain region or a source region of the transistor.

19. The semiconductor device of claim 12, wherein the T-shaped gate comprises a horizontal portion of the T-shaped gate over a vertical portion of the T-shaped gate, the horizontal portion extending substantially symmetrically laterally out from the vertical portion of the T-shaped gate, and wherein the semiconductor device further comprises another inverted-T-shaped contact, the another inverted-T-shaped contact also being self-aligned, at least in part, to the T-shaped gate of the transistor and being on an opposite side of the T-shaped gate from the inverted-T-shaped contact.

20. The semiconductor device of claim 12, wherein the T-shaped gate comprises a horizontal portion of the T-shaped gate over a vertical portion of the T-shaped gate, the horizontal portion extending asymmetrical laterally out from the vertical portion of the T-shaped gate, and wherein the semiconductor device further comprises another contact, the another contact being non-self-aligned to the T-shaped gate of the transistor, and being on an opposite side of the T-shaped gate from the inverted-T-shaped contact.

* * * * *